United States Patent [19]

Kim

[11] Patent Number: 5,714,898
[45] Date of Patent: Feb. 3, 1998

[54] POWER SUPPLY CONTROL CIRCUIT

[75] Inventor: Kyung Saeng Kim, Seoul, Rep. of Korea

[73] Assignee: LG Semicon Co., Ltd., Choonchungbook-do, Rep. of Korea

[21] Appl. No.: 582,724

[22] Filed: Jan. 4, 1996

[30] Foreign Application Priority Data

Oct. 19, 1995 [KR] Rep. of Korea ............... 36164/1995

[51] Int. Cl.$^6$ ................................................... H03L 7/00
[52] U.S. Cl. ....................................... 327/143; 327/198
[58] Field of Search ...................................... 327/142, 143, 327/198, 80, 309

[56] References Cited

U.S. PATENT DOCUMENTS

| | | | |
|---|---|---|---|
| 4,446,381 | 5/1984 | Dairymple | 327/143 |
| 4,626,704 | 12/1986 | Takata et al. | 307/264 |
| 4,633,107 | 12/1986 | Norsworthy | 307/594 |
| 4,697,097 | 9/1987 | Rusznyak | 307/296 R |
| 4,939,385 | 7/1990 | Dubujet | 327/143 |
| 4,948,995 | 8/1990 | Takahashi | 307/594 |
| 4,970,408 | 11/1990 | Hanke et al. | 307/272.3 |
| 5,302,861 | 4/1994 | Jelinek | 327/143 |
| 5,321,317 | 6/1994 | Pascucci et al. | 307/296.4 |
| 5,323,067 | 6/1994 | Shay | 307/272.3 |
| 5,451,896 | 9/1995 | Mori | 327/80 |
| 5,602,502 | 2/1997 | Jiang | 327/143 |

*Primary Examiner*—Timothy P. Callahan
*Assistant Examiner*—Jung Ho Kim
*Attorney, Agent, or Firm*—Morgan, Lewis & Bockius LLP

[57] ABSTRACT

An improved power supply control circuit capable of restricting operation of a peripheral circuit before the level of voltage is stabilized and permitting the peripheral circuit to operate after the level of voltage is stabilized, which includes a level detecting unit having a plurality of serially connected transistors for decreasing the level of voltage applied to one side thereof in order; and a disenable signal generating unit, which has MOS transistors having a different channel and connected between voltage and the ground, for receiving a different level of voltage from the level detecting unit and for generating a certain disenable signal when the voltage reaches a certain level.

17 Claims, 5 Drawing Sheets

POWER SUPPLY CONTROL CIRCUIT

BACKGROUND OF THE INVENTION

1. Field of the Invention

The present invention relates to a power supply control circuit, and in particular to an improved power supply control circuit capable of restricting operation of a peripheral circuit before the voltage level is stabilized and permitting the peripheral circuit to operate after the voltage level is stabilized.

2. Description of the Conventional Art

As is well known to those skilled in the art, when turning on a power switch, a certain voltage is applied to corresponding elements. Here, at the moment that the power switch is turned on, the output voltage of the power supply is unstable for a certain time. Therefore, a disenable circuit is provided for preventing the above-mentioned problems. The disenable circuit outputs a certain enable signal to restrict the operation of the system before the output voltage becomes stable. That is, it is directed to permit the system to operate when a certain voltage proper to the system is applied thereto.

FIG. 1 shows a conventional power supply including a level detection unit 10 and an inverting unit 20. The level detection unit 10 has PMOS transistors PM1 and PM2 and an NMOS transistor NM1 connected in series between a voltage Vcc and the ground for detecting voltage level of the voltage Vcc when power is turned on. The inverting unit 20 has NMOS transistors PM3 and NM2 with different channel types connected in series between the voltage Vcc and the ground for outputting a disenable signal DE so as to stabilize the operation of each element in accordance with an output signal of the level detection unit 10.

The operation of the conventional power supply control circuit will now be explained with reference to FIG. 2.

To begin, the current driving capacity of the PMOS transistor PM1 through PM3 is about ten times that of the NMOS transistors NM1 and NM2, and the absolute value of the threshold voltage Vth of the MOS transistors has a similar value. In addition, before switching on the power switch, the voltages at the contact points N1 through N3 are ground.

In the above-mentioned state, when the power switch (not shown) is turned on at T=t0 as shown in FIG. 2, the voltage Vcc is slightly increased. Thereafter, when T=t1, the voltage Vcc is increased to the threshold voltage Vth of the PMOS transistor PM1. That is, the PMOS transistor PM1 is turned on, and the voltage at the contact point N3 is increased. In addition, as the voltage Vcc is increased, the NMOS transistor NM1 is turned on. However, since the PMOS transistor PM2 is still turned off, the voltage level at the contact N1 is a low level. Therefore, since the PMOS transistor PM3 is turned on and the NMOS transistor NM2 is turned off, the inverting unit 20 outputs a high level disenable signal DE.

Thereafter, when T=t2, the voltage Vcc is increased to twice the threshold voltage 2Vth. Therefore, the PMOS transistor PM2 is turned on, and the voltage at the contact point N1 is increased. As voltage at contact point N1 is increased, the NMOS transistor NM2 is turned on at T=t3, and the voltage level at the contact point N2 changes to a low level from the high level. In addition, after T=t3, the PMOS transistors PM1 and PM2 and the NMOS transistors NM1 and NM2 are turned on, and the PMOS transistor PM3 is turned off. The inverter 20 outputs a low level disenable signal DE.

That is, for time t1 through t3, in which the level of the voltage Vcc is unstable, a high level disenable signal DE is outputted, and after T=t3, after which the voltage Vcc becomes stable, a low level disenable signal DE is outputted.

However, in the above-mentioned construction, after T=t3, significant current flows through the PMOS transistors PM1 and PM2 and the NMOS transistor NM1 which are connected in series between the voltage Vcc of the level detecting unit 10 and ground. Therefore, in order to reduce current consumption, the gate of the NMOS transistor NM1 is connected to the disenable signal DE as shown in FIG. 3, and the disenable signal DE is connected to the output terminal N2. Therefore, the NMOS transistor NM1 is turned off in accordance with a disenable signal DE convened to a lower level after T=t3 is turned off and the current pass is blocked, so that current consumption is prevented.

However, when the current driving capacity of the NMOS transistor NM1 of the level detection unit 10 is not substantially small compared to the PMOS transistors PM1 and PM2, it is impossible to enable the voltage of the contact point N1 to have a high level, so that the disenable signal DE cannot be a low level.

SUMMARY OF THE INVENTION

Accordingly, it is an object of the present invention to provide a power supply control circuit which overcomes the problems encountered in a conventional power supply control circuit.

It is another object of the present invention to provide an improved power supply control circuit capable of restricting operation of a peripheral circuit before the voltage level is stabilized and permitting the peripheral circuit to operate after the voltage level is stabilized.

To achieve the above objects, there is provided a power supply control circuit, which includes a level detecting unit having a plurality of serially connected transistors for decreasing the level of voltage applied to one side thereof in order; and a disenable signal generating unit, which has MOS transistors having a different channel and connected between voltage and the ground, for receiving a different level of voltage from the level detecting unit and for generating a certain disenable signal when the voltage reaches a certain level.

DETAILED DESCRIPTION OF THE INVENTION

Figure 1:
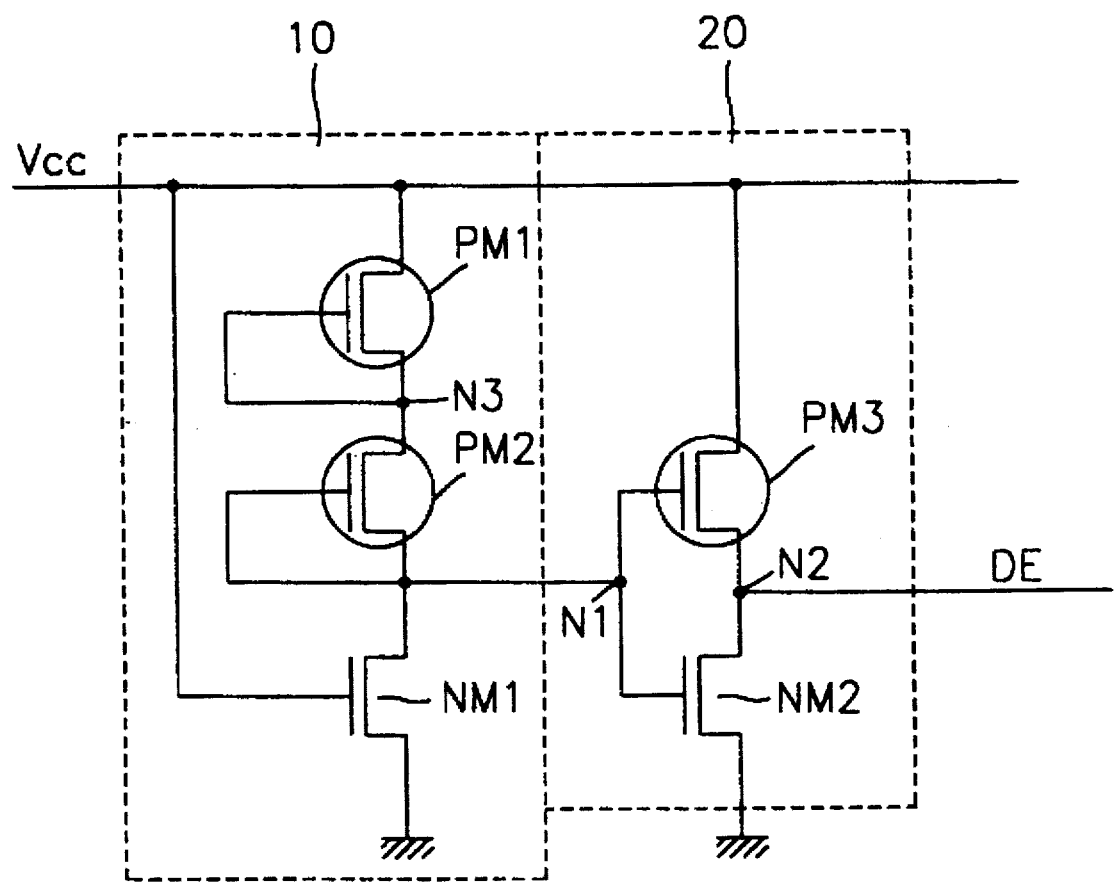
FIG. 1 is a circuit diagram of a conventional power supply circuit.
Figure 2:
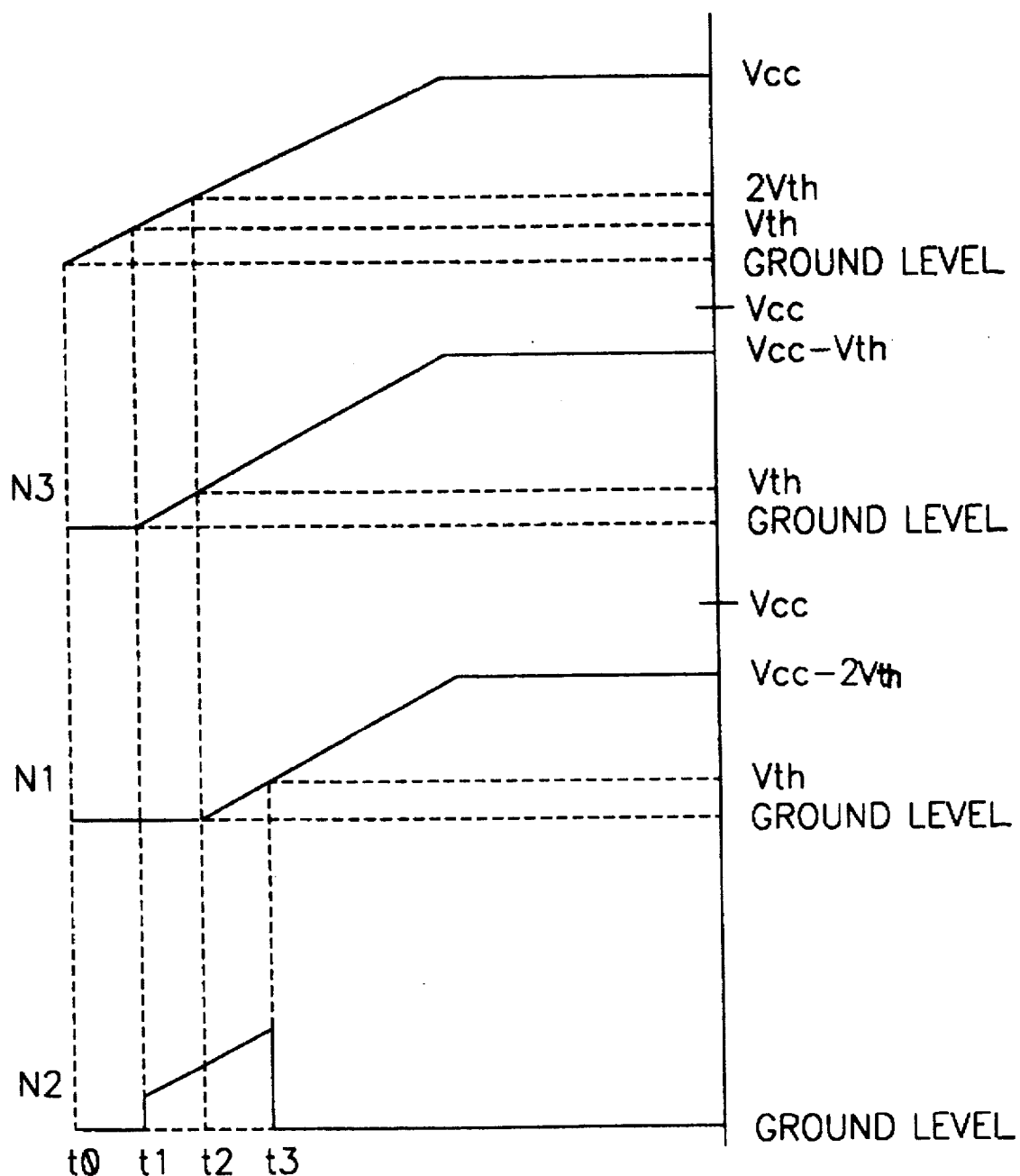
FIG. 2 is a waveform at each contact point of elements of FIG. 1.
Figure 3:
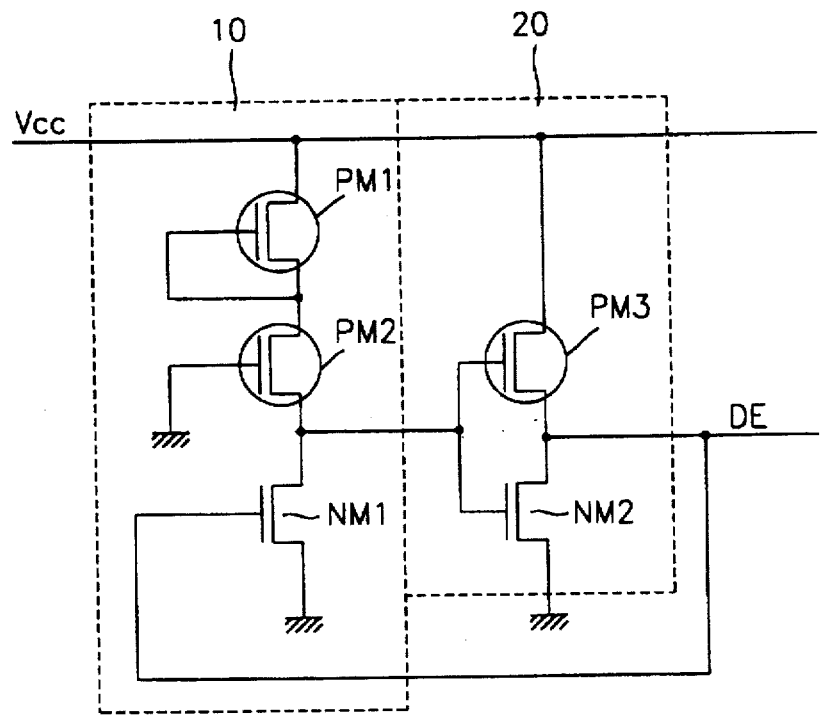
FIG. 3 is a circuit diagram of another conventional power supply circuit.
Figure 4:
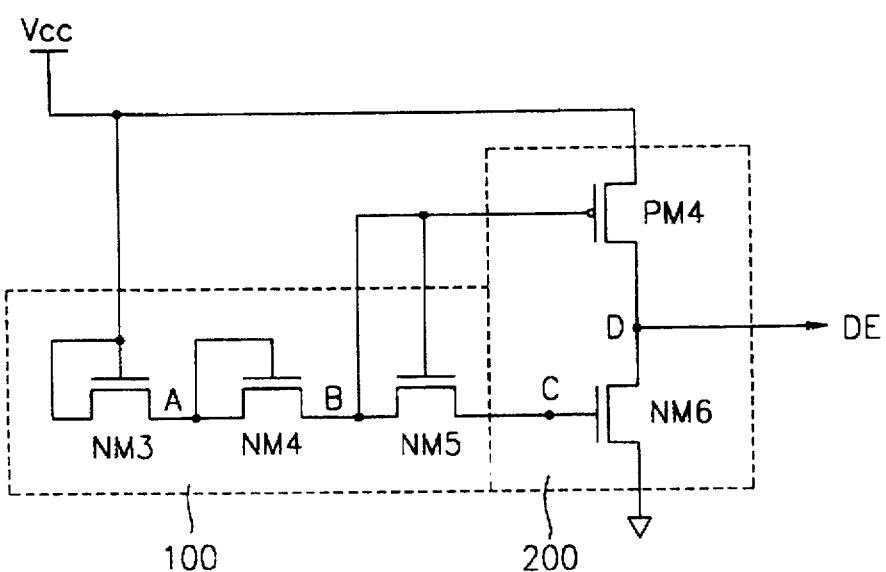
FIG. 4 is a circuit diagram of a power supply control circuit of a first embodiment according to the present invention.

FIG. 4 shows a power supply control circuit of a fast embodiment according to the present invention including a level detection unit 100 and a disenable signal generation unit 200. The level detection unit 100 has a plurality of NMOS transistors NM3 through NM5 each having a gate connected in series to the drain thereof for reducing the voltage Vcc level by a predetermined level applied to the gate-drain contact point of the NMOS transistor NM3 when the power switch is turned on. The disenable signal generating unit 200 has MOS transistors PM4 and NM6, each with a different channel type, connected sequentially between the voltage Vcc and the ground, for generating a disenable signal DE in accordance with an output signal of the level detection unit 100, wherein the gate of the PMOS transistor PM4 is connected to the gate-drain contact point of the NMOS transistor NM5, and the gate of the NMOS transistor NM6 is connected to the source of the NMOS transistor NM5.

Here, the NMOS transistors NM3 through NM5, of which the drain and gate thereof are connected to each other and used as a resistor, is called as a node transistor in this embodiment. In addition, the threshold voltage Vth of each MOS transistor adopted in this embodiment has the same absolute value.

Figure 5:
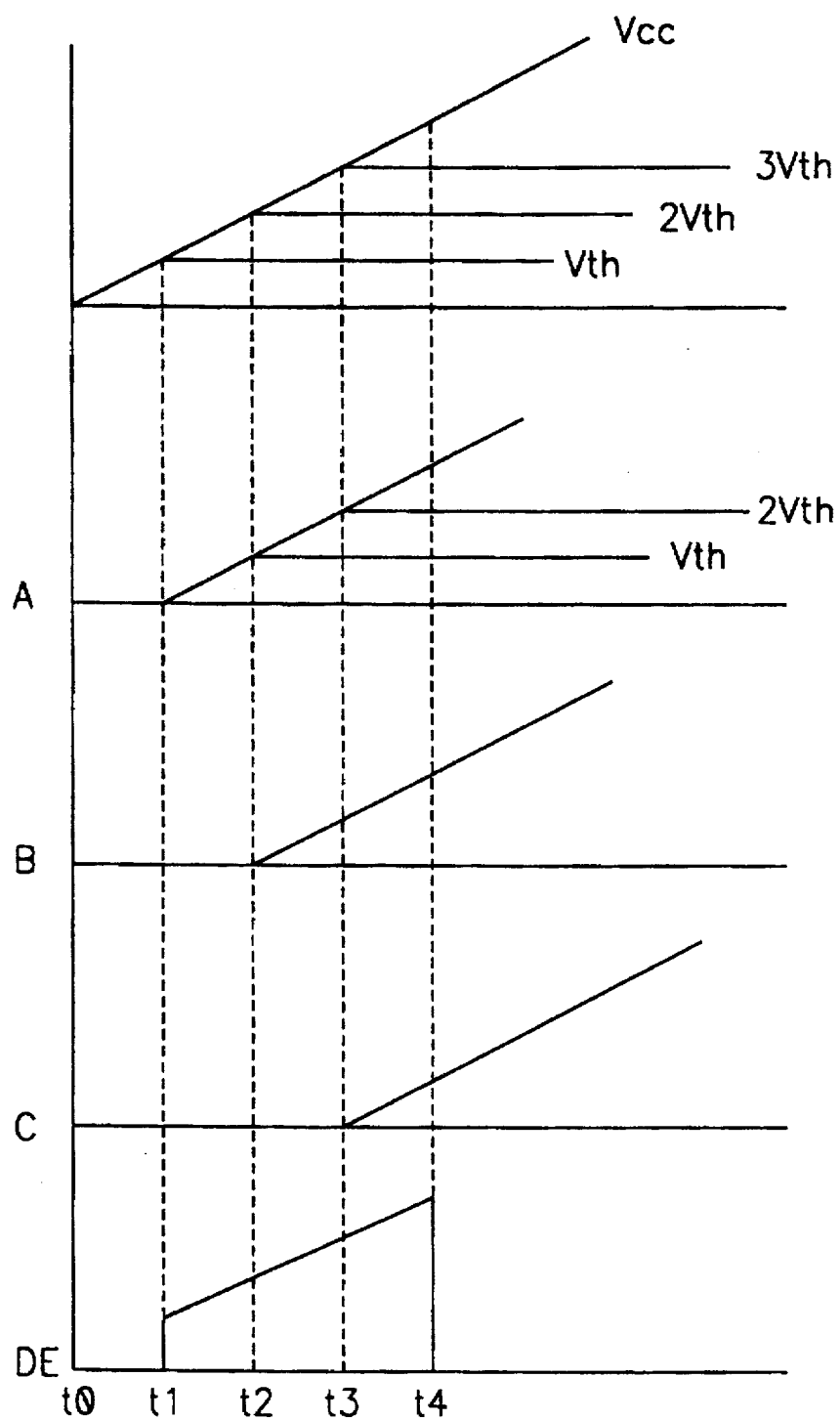
FIG. 5 is a waveform at each contact point of the elements of FIG. 4 according to the present invention.

To begin with, when the voltage Vcc is at a ground level, all of the electric levels at contact points A, B, C, and D are at the ground level. In the above-mentioned state, when the power switch (not shown) is turned on at T=t0, the voltage Vcc as shown in FIG. 5 is slightly increased. When t=t1 and the voltage Vcc is increased to the threshold voltage Vth of the NMOS transistor NM3, the NMOS transistor NM3 is turned on, and the voltage at the contact point A is increased. At this time, a low level voltage is applied to the gate of the PMOS transistor PM4, and the PMOS transistor PM4 is turned on, and a high level disenable signal DE, as shown in FIG. 5, is output.

As the voltage Vcc is continuously increased, when the voltage is about twice the threshold voltage 2Vth at T=t2, the NMOS transistor NM4 is turned on, and the voltage at the contact point B is increased. In addition, when the voltage Vcc is three times the threshold voltage 3Vth at T=t3, the NMOS transistor NM5 is turned on, and the voltage at the contact point C is increased. In addition, since the voltage at the contact point B exceeds the threshold voltage which causes the PMOS transistor PM4 to be turned off, the PMOS transistor PM4 is turned off. As the above-mentioned PMOS transistor PM4 is turned off, and when the voltage at the contact point C is larger than the threshold voltage of the NMOS transistor NM6 of the disenable signal generating unit 200 at T=t4, the NMOS transistor NM6 is turned on, and the electric level at the contact point becomes a low level. That is, a high level disenable signal DE is output while the voltage Dcc is unstable so as to restrict the operation of the peripheral circuit, and at the time when the level of the voltage Vss is stable, a low level disenable signal DE is output and the operation of the peripheral circuit is operated.

Figure 6:
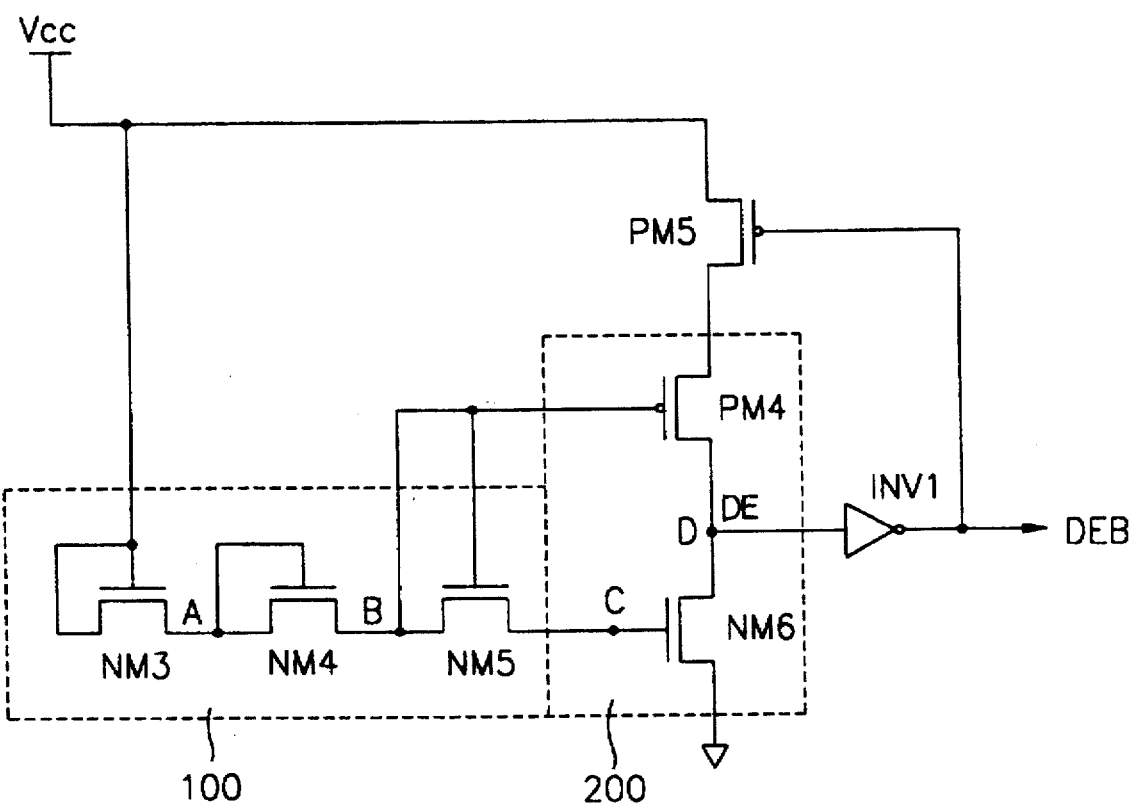
FIG. 6 is a circuit diagram of a power supply control circuit of a second embodiment according to the present invention.

FIG. 6 shows a power supply control circuit of a second embodiment according to the present invention, which further includes an inverter INV1 for inverting a disenable signal DE outputted from the contact point D, and a PMOS transistor PM5 having the source connected to the voltage Vcc, the gate connected to the output terminal of the inverter INV1, and the drain connected to the source of the PMOS transistor PM4.

A signal DEB, which a high level disenable signal DE is inverted to a low level by the inverter INV1 while the level of the voltage Vcc is unstable, is applied to the gate of the PMOS transistor PM5. Therefore, the PMOS transistor PM5 is turned on, and the voltage is applied to the source of the PMOS transistor PM4. However, when the level of the voltage Vcc becomes stable, the signal DEB which a low level disenable signal DE is inverted to a high level by the inverter INV1 is applied to the gate of the PMOS transistor PM5. Therefore, the PMOS transistor PM5 is turned off, and the voltage Vcc is blocked, and the disenable signal DE has a stable state. Therefore, the PMOS transistor PM5 acts as a current clamp circuit which is directed to stabilizing the disenable signal DE.

As described above, the power supply control circuit is directed to reducing current voltage consumption because a current voltage pass is not provided in the level detecting unit which detects the level of the voltage applied thereto and more stably performing the operation of the system irrespective of the driving capacity of the MOS transistors NM3 through NM5. In addition, since the gates of the MOS transistors PM4 and NM6 of the disenable signal generating unit receive a different level of the voltages of the contact points B and C, a more current consumption is reduced.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A power supply control circuit, comprising:
   a level detecting unit having a plurality of serially connected transistors for providing first and second decreased voltages from a voltage applied to a first of the serially connected transistors;
   a disenable signal generating unit having at least two MOS transistors with different channel types directly connected between the applied voltage and ground, the disenable signal generating unit receiving the first and second decreased voltages from the level detecting unit and generating a disenable signal when the applied voltage reaches a certain level; and
   a current clamping unit which applies the applied voltage to the disenable signal generating unit when a first state signal is output from the disenable signal generating unit, and which blocks the supplied voltage from the disenable signal generating unit when a second state signal is output from the disenable signal generating unit.

2. The circuit according to claim 1, wherein the plurality of transistors of the level detecting unit are NMOS transistors each having the gate and drain terminals commonly connected to generate a potential difference across each one of the plurality of transistors equal to a threshold voltage of the respective transistors.

3. The circuit according to claim 1, wherein the disenable signal generating unit includes a PMOS transistor and an NMOS transistor, and wherein the first and second decreased voltages are provided to the gates of the PMOS transistor and the NMOS transistor, respectively.

4. The circuit according to claim 3, wherein the first decreased voltage has a greater level than the second decreased voltage.

5. The circuit according to claim 4, wherein after the first decreased voltage reaches a level capable of turning off the PMOS transistor, the level of the second decreased voltage begins to increase.

6. The circuit of claim 1, wherein the current clamping unit includes a PMOS transistor connected between the applied voltage and the disenable signal generating unit, and wherein the source is connected to the applied voltage, the drain is connected to the disenable signal generating unit, and the gate receives an inverted output signal from the disenable signal generating unit.

7. A power supply control circuit operating in response to a supplied voltage, the circuit comprising:

- a level detecting circuit including a plurality of serially connected transistors having the respective gate and drain connected, the drain of a leading one of the plurality of serially connected transistors receiving the supplied voltage; and
- a disenable signal generating unit including first and second transistors of different channel types serially connected between the supplied voltage and ground, and a contact point disposed between the first and second transistors, wherein the gate of the first transistor is connected to the drain of a terminal one of the plurality of serially connected transistors and wherein the gate of the second transistor is connected to the source of the terminal one of the plurality of serially connected transistors, wherein a disenable signal is output from the contact point.

8. The circuit according to claim 7, wherein the plurality of serially connected transistors of the level detecting unit include NMOS transistors, and wherein a potential difference results across each one of the plurality of transistors, the potential difference equal to a threshold voltage of the respective transistors.

9. The circuit according to claim 7, wherein the first and second transistors of the disenable signal generating unit are PMOS and NMOS transistors, respectively, and wherein the gate of the PMOS transistor receives a greater voltage than the NMOS transistor.

10. The circuit according to claim 9, wherein after the voltage applied to the gate of the first transistor of the disenable signal generating unit reaches a level capable of turning off the first transistor, the level of the voltage applied to the gate of the second transistor of the disenable signal generating unit begins to increase.

11. The circuit according to claim 7, wherein the gates of the first and second transistors of the disenable signal generating unit receive different voltages.

12. The circuit according to claim 11, wherein the gate of the first transistor of the disenable signal generating unit receives a greater voltage than the gate of the second transistor of the disenable signal generating unit.

13. The circuit according to claim 12, wherein after the voltage applied to the gate of the first transistor of the disenable signal generating unit reaches a level capable of turning off the first transistor, the level of the voltage applied to the gate of the second transistor of the disenable signal generating unit increases.

14. The circuit according to claim 7, wherein after the voltage applied to the gate of the first transistor of the disenable signal generating unit reaches a level capable of turning off the first transistor, the level of the voltage applied to the gate of the second transistor of the disenable signal generating unit begins to increase.

15. The circuit according to claim 7, further comprising a current clamping unit which applies the supplied voltage to the disenable signal generating unit when a first state signal is output from the contact point, and which blocks the supplied voltage from the disenable signal generating unit when a second state signal is output from the contact point.

16. The circuit of claim 15, wherein the current clamping unit includes a PMOS transistor connected between the supplied voltage and the disenable signal generating unit, and wherein the source is connected to the supplied voltage, the drain is connected to the disenable signal generating unit and the gate receives an inverted output signal from the contact point.

17. The circuit according to claim 1, wherein the plurality of transistors of the level detecting unit are NMOS transistors each having the gate and drain terminals commonly connected to generate a potential difference across each one of the plurality of transistors equal to a threshold voltage of the respective transistors, wherein the first and second decreased voltages are respectively provided from the drain and the source of a terminal one of the plurality of transistors of the level detecting unit, wherein the disenable signal generating unit includes a PMOS transistor and an NMOS transistor, and wherein the first and second decreased voltages are directly provided to the respective gates of the PMOS transistor and the NMOS transistor.

* * * * *

UNITED STATES PATENT AND TRADEMARK OFFICE
CERTIFICATE OF CORRECTION

PATENT NO. : 5,714,898
DATED : February 3, 1998
INVENTOR(S) : Kim

It is certified that error appears in the above-identified patent and that said Letters Patent is hereby corrected as shown below:

Column 5, line 9, insert --each-- after "transistors".

Signed and Sealed this

Nineteenth Day of January, 1999

Attest:

Attesting Officer

*Acting Commissioner of Patents and Trademarks*